United States Patent
Farbiz et al.

(10) Patent No.: US 9,829,526 B2
(45) Date of Patent: Nov. 28, 2017

(54) TRANSMISSION LINE PULSING

(71) Applicant: Texas Instruments Incorporated, Dallas, TX (US)

(72) Inventors: Farzan Farbiz, Dallas, TX (US); Akram A. Salman, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 955 days.

(21) Appl. No.: 13/667,215

(22) Filed: Nov. 2, 2012

(65) Prior Publication Data

US 2013/0214616 A1 Aug. 22, 2013

Related U.S. Application Data

(60) Provisional application No. 61/601,361, filed on Feb. 21, 2012.

(51) Int. Cl.
| | | |
|---|---|---|
| *H03H 11/30* | (2006.01) | |
| *G01R 31/00* | (2006.01) | |
| *H03H 7/40* | (2006.01) | |

(52) U.S. Cl.
CPC ............ *G01R 31/001* (2013.01); *H03H 7/40* (2013.01); *H03H 11/30* (2013.01); *Y10T 307/74* (2015.04); *Y10T 307/747* (2015.04)

(58) Field of Classification Search
CPC ........ H03K 17/102; H02B 1/24; H01R 29/00; H02J 3/04; H02M 1/088; G01R 31/001; Y10T 307/74; Y10T 307/747; H03H 11/30; H03H 7/40; H01H 59/0009
USPC .................................................. 307/112, 113
See application file for complete search history.

(56) References Cited

U.S. PATENT DOCUMENTS

| | | | | | |
|---|---|---|---|---|---|
| 2,548,672 | A | * | 4/1951 | Lewis | 333/227 |
| 2,650,350 | A | * | 8/1953 | Heath | 332/112 |
| 2,769,101 | A | * | 10/1956 | Drosd | 307/108 |
| 3,260,865 | A | * | 7/1966 | Jelinek-Fink et al. | 307/109 |
| 3,763,445 | A | * | 10/1973 | Hannaford et al. | 333/160 |
| 5,138,270 | A | * | 8/1992 | Nakata et al. | 327/179 |
| 5,519,327 | A | * | 5/1996 | Consiglio | 324/678 |
| 5,783,975 | A | * | 7/1998 | Nakamura | 333/101 |
| 5,835,534 | A | * | 11/1998 | Kogure | 375/257 |

(Continued)

FOREIGN PATENT DOCUMENTS

| | | |
|---|---|---|
| CN | 102195594 A | 6/2011 |
| EP | 0785589 A1 | 7/1997 |

OTHER PUBLICATIONS

T. Daenen, S. Thijs, M. I. Natarajan, V.Vassilev, V. De Heyn, G. Groeseneken, "Multilevel Transmission Line Pulse (MTLP) Tester," 2004 EOS/ESD Symposium, 6 pages.

(Continued)

*Primary Examiner* — Thienvu Tran
*Assistant Examiner* — Brian K Baxter
(74) *Attorney, Agent, or Firm* — Tuenlap D. Chan; Charles A. Brill; Frank D. Cimino

(57) ABSTRACT

A circuit and method for electrostatic discharge testing using transmission line pulsing. A plurality of transmission line networks may be connected to a device under test, and each transmission line network may have different connected terminations. Switches may be used to select which transmission line networks are connected to the device under test, and which terminations, if any, are connected to transmission line networks.

16 Claims, 3 Drawing Sheets

(56) References Cited

U.S. PATENT DOCUMENTS

| | | | | |
|---|---|---|---|---|
| 7,705,622 | B1* | 4/2010 | Grund | 324/750.3 |
| 2003/0174022 | A1* | 9/2003 | Zamir et al. | 330/253 |
| 2006/0289461 | A1* | 12/2006 | Kojima et al. | 219/497 |
| 2007/0268012 | A1* | 11/2007 | Kawabata | 324/120 |
| 2008/0079317 | A1* | 4/2008 | Chen | G06F 1/26 307/112 |
| 2008/0303353 | A1* | 12/2008 | Yu | H02J 13/0003 307/131 |
| 2010/0231278 | A1* | 9/2010 | London | 327/171 |
| 2010/0289597 | A1* | 11/2010 | Wolfe et al. | 333/104 |
| 2012/0038222 | A1* | 2/2012 | Heeren et al. | 307/106 |
| 2012/0049985 | A1* | 3/2012 | Kawai | H03H 7/465 333/22 R |
| 2013/0120217 | A1* | 5/2013 | Ueda et al. | 343/860 |
| 2013/0155554 | A1* | 6/2013 | Wang et al. | 361/56 |

OTHER PUBLICATIONS

Evan Grund, "Snapback Device Studies Using Multilevel TLP and Multi-Impedance TLP Testers," Oryx Instruments Corp., 9 pages.

T. J. Maloney, N. Khurana, "Transmission Line Pulsing Techniques for Circuit Modeling," 1985 EOS/ESD Symposium, 6 pages.

Notification of First Office Action, State Intellectual Property Office of PRC, dated Sep. 2, 2016.

Notification of Second Office Action, State Intellectual Property Office of PRC, dated May 19, 2017.

English Machine Translation for CN102195594A.

\* cited by examiner

TRANSMISSION LINE PULSING

This application claims the benefit of U.S. Provisional Application No. 61/601,361, filed Feb. 21, 2012, which is hereby incorporated by reference.

BACKGROUND

Electrostatic discharge (ESD) is typically a high-voltage short-duration event, typically involving voltages in the range of hundreds to thousands of volts, and a typical duration of 10 to 150 nanoseconds. Devices such as electronic components, electronic circuits and systems, and larger systems such as automobiles, are commonly tested to confirm that they can withstand various standardized ESD events. For ESD testing, one common way to emulate ESD in a standard manner is to charge a floating transmission line to a pre-determined high voltage, and then discharge the transmission line into a Device Under Test (DUT). This method is called Transmission Line Pulsing (TLP). FIG. 1A illustrates a basic TLP test system 100. A high voltage DC supply 102 charges a transmission line 106 through a high impedance ($R_s$) and a switch 104. After the transmission line 106 is charged, the switch 104 connects one end of the transmission line to a DUT 108. The transmission line 106 generates a single voltage pulse with a pulse width determined by the propagation time along the length of the transmission line. A termination impedance $R_L$ matches the impedance of the transmission line 106 to prevent reflections.

Some ESD events may be more complex than a single voltage pulse. For example, they may involve a positive pulse followed by a negative pulse. In FIG. 1A, if the termination resistance $R_L$ is eliminated (effectively infinite termination resistance), then a reflected pulse will be generated having an opposite polarity from the high voltage DC power supply. Alternatively, the termination resistance may be made a different impedance than the impedance of the transmission line and the voltage waveform will be partially reflected at the impedance discontinuity.

In some test systems, the goal of ESD testing is to confirm that the DUT can withstand a standard emulated ESD voltage waveform. In other test systems, the goal is to characterize the impedance of a device or circuit that is intended to protect a system during ESD. A protective device (for example, a silicon controlled rectifier or thyristor) may turn on (called snapback) at a high voltage, and then conduct current at a reduced voltage (called the holding point). The voltage waveforms needed to characterize the impedance of a protective device at multiple current levels need to have a peak voltage sufficient to turn on the protective device and then "stair step" down to one or more holding point voltages. The resulting test system is called a multilevel TLP system. FIG. 1B illustrates an example multilevel TLP test system 110. In FIG. 1B, there are two transmission line sections (114, 116) of different lengths, in series, separated by a series resistor $R_{SERIES}$. Both sections are pre-charged. When the switch 118 is closed, a pulse is generated in each section of the transmission line. The voltages are partially reflected in each section of the transmission line at each impedance discontinuity. The pulses and reflections add and cancel at the DUT to form a "stair-stepped" multi-level voltage pulse. There are many variations, with varying placements of the DUT, switches, and resistances.

There are many different standards for ESD test systems for different product categories. There are standard systems that emulate ESD originating from a person (Human Body Model), standard systems for the automotive industry (ISO 10605, Zwickau), standard systems for electronic products such as cell phones, computers and televisions (IEC 61000-4-2), and standard systems specified by other standards bodies such as JEDEC, ESDA, and JIETA. Some ESD tests need complicated setups that are typically done only by the manufacturers of a final product, such as an automobile. This is a problem for vendors supplying parts or subsystems for multiple final product categories. The parts and subsystems vendors need to be able run a wide variety of different standard tests. There is a need for an ESD test system that can flexibly produce a wide variety of voltage waveforms consistent with a wide variety of industry ESD test standards.

DETAILED DESCRIPTION

Figure 1A:
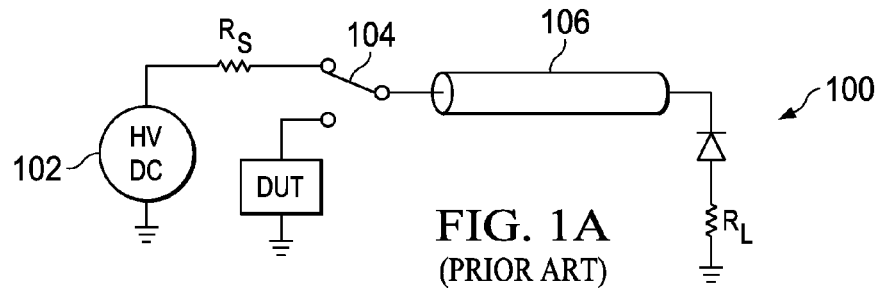
FIG. 1A is a simplified block diagram schematic of an example prior art transmission line pulse system.
Figure 1B:
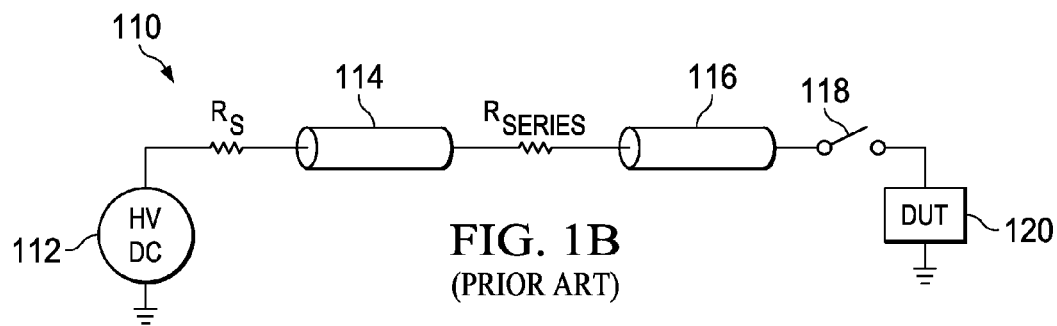
FIG. 1B is a simplified block diagram schematic of an example alternative prior art transmission line pulse system.
Figure 2:
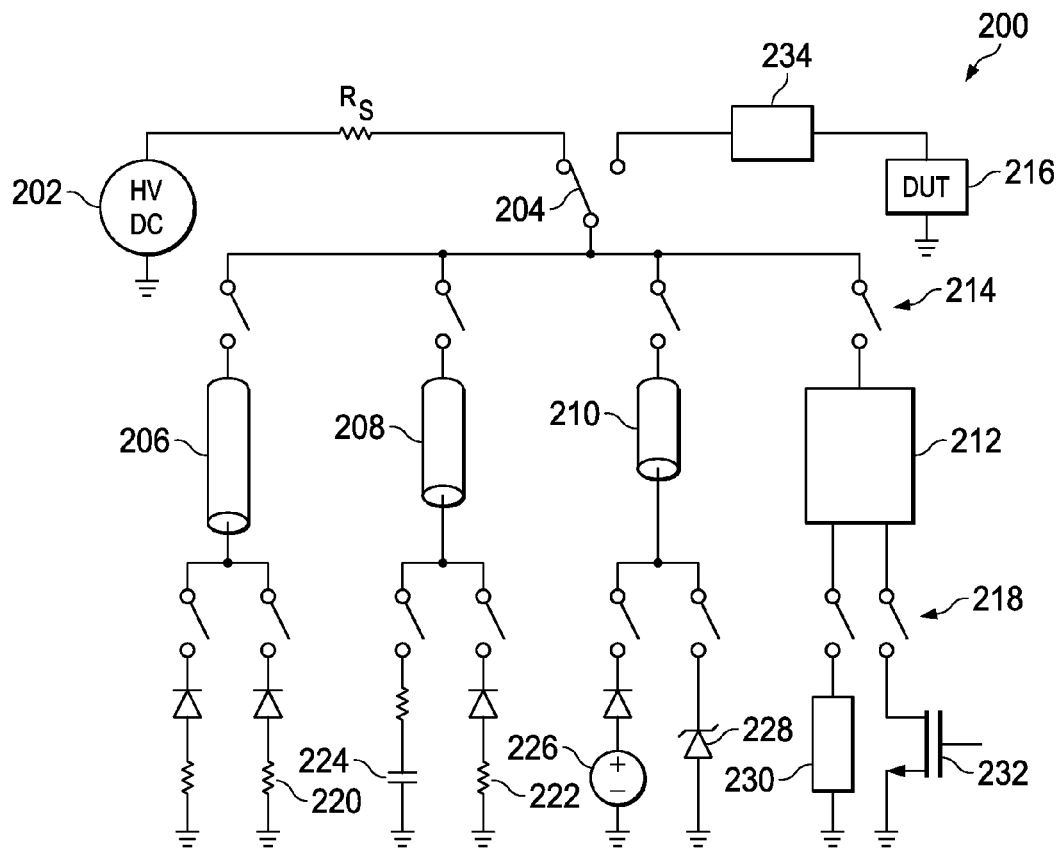
FIG. 2 is a simplified block diagram schematic of an example embodiment of a transmission line pulse system.

FIG. 2 illustrates an example embodiment of a TLP system 200 that can generate a wide variety of waveforms. System 200 includes a high-voltage DC power supply 202 and networks of transmission lines (206, 208, 210, 212). A first switch 204 connects the power supply 202 to first ends of a portion of the networks of transmission lines. Switch 204 then connects the first ends of the portion of the networks of transmission lines to a DUT 216. Second switches 214 determine which networks of transmission lines are charged by the power supply, and which networks of transmission lines are coupled to the DUT 216. Third switches 218 determine which second ends of transmission line networks, if any, are connected to terminations. Note that the transmission line networks selected by the second switches 214, with connected terminations selected by third switches 218, are effectively connected in parallel. In the example of FIG. 2, there may also be an impedance 234 in series with the DUT 216. A network may be an individual transmission line, or a network may comprise multiple transmission lines, as discussed in more detail in conjunction with FIGS. 5A-5D. The transmission lines may have various lengths and various characteristic impedances.

In the example illustrated in FIG. 2, each individual transmission line network can be connected to one of two terminations, or may be left open. A network of transmission lines (for example, network 212) may be connected to multiple terminations (for example, terminations 230 and 232) or may be left open. Termination 220 may be, for example, an impedance that matches the characteristic impedance of transmission line 206 to prevent reflections. Termination 222 may be, for example, an impedance that results in partial reflections in transmission line 208. Leaving a switch 218 open for a transmission line leaves the end of the transmission line open (essentially infinite impedance) to provide a full magnitude reflection. The number and types of terminations are just examples for purposes of illustration. There may be any number of terminations and any variety of terminations available for each transmission line network. In addition, a transmission line network may be connected to multiple terminations. Terminations may also include, for example, capacitors, inductors, fixed or variable voltage sources, Zener diodes, variable resistances, non-linear resistances, and active devices. Impedance networks and/or active devices can then be used to generate oscillatory waveforms, or exponentially decaying waveforms, or other more complex waveforms. In FIG. 2, some illustrated examples include a capacitive network 224, a voltage clamp 226, a Zener diode 228, a non-linear resistance 230, and an active device 232.

In the example system 200 of FIG. 2, transmission lines may have different characteristic impedances. For example, in FIG. 2, transmission line 208 may have the same characteristic impedance as transmission line 206, or transmission line 208 may have a different characteristic impedance than transmission line 206. Transmission lines having different characteristic impedances provide additional flexibility in generating complex waveforms, particularly in transmission line networks (discussed in more detail in conjunction with FIGS. 5A, 5B, 5C, and 5D).

To further illustrate the function of the system 200 of FIG. 2, assume, for example, that transmission lines 206 and 208 are charged. Assume further that transmission line 206 is connected to termination 220 and that the impedance of termination 220 suppresses reflections for transmission line 206. Assume further that transmission line 208 is connected to termination 222 and that the impedance of termination 222 suppresses reflections for transmission line 208. Assume further that transmission line 208 is half the length of transmission line 206. The resulting idealized waveforms are illustrated in FIGS. 3A-3C.

Figure 3A:
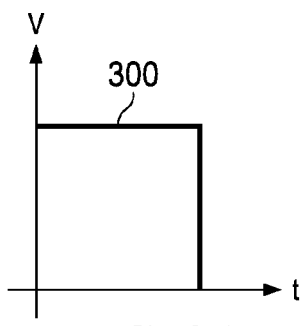
FIG. 3A is a timing diagram illustrating an example voltage waveform generated by a transmission line in the system illustrated in FIG. 2.
Figure 3B:
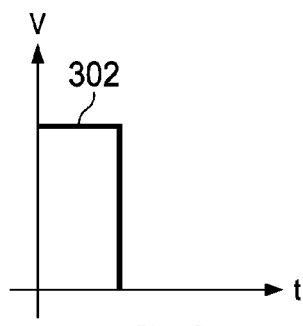
FIG. 3B is a timing diagram illustrating an example voltage waveform generated by a second transmission line in the system illustrated in FIG. 2.
Figure 3C:
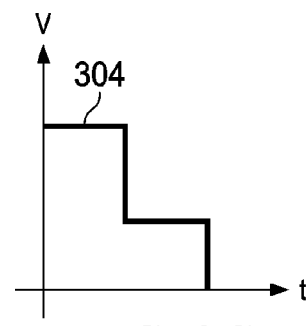
FIG. 3C is a timing diagram illustrating an example voltage waveform generated at the DUT in the system illustrated in FIG. 2.

In FIG. 3A, transmission line 206 generates a pulse 300 with no reflections. In FIG. 3B, transmission line 208 also generates a pulse 302, half the duration of the pulse generated by transmission line 206, with no reflections. As illustrated in FIG. 3C, at first the pulse from transmission line 208 adds to the pulse being generated by transmission line 206. Then, when the pulse from transmission line 208 ends, the resulting voltage waveform 304 at the DUT takes a step down. In FIG. 3C a single step down is illustrated to simplify explanation, but other combinations, with partial reflections from multiple transmission lines, can generate a waveform having multiple steps.

Figure 4:
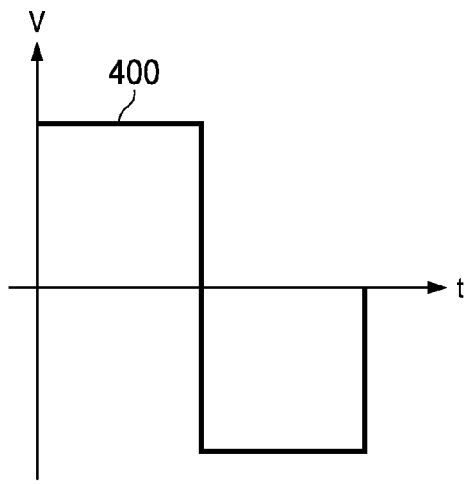
FIG. 4 is a timing diagram illustrating an example alternative voltage waveform generated by a transmission line in the system illustrated in FIG. 2.

Alternatively, assume that only transmission line 206 is charged, and further assume that transmission line 206 is not connected to any termination. In FIG. 4, the resulting waveform 400 at the DUT has a positive pulse followed by a negative reflection. As a further alternative, a termination having an inductor and a capacitor in series can provide an oscillating waveform. As still another alternative, a termination having a resistor and a capacitor in series can provide an exponentially decaying waveform.

Figure 5A:
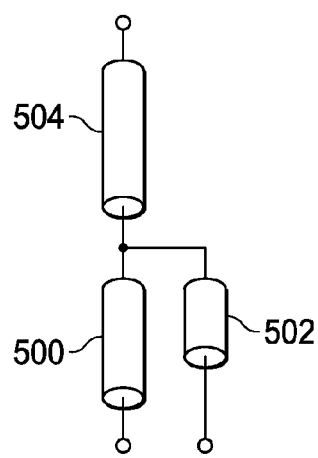
FIGS. 5A, 5B, 5C, and 5D are block diagram schematics illustrating alternative example embodiments of transmission line networks.
Figure 5B:
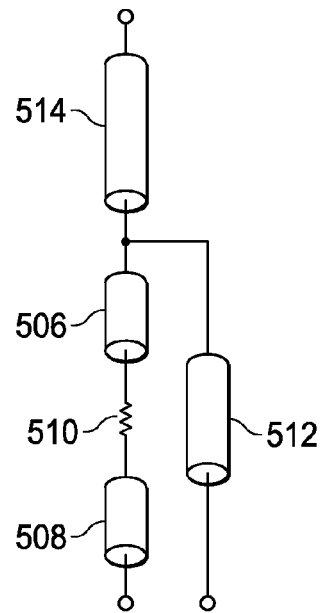
Figure 5C:
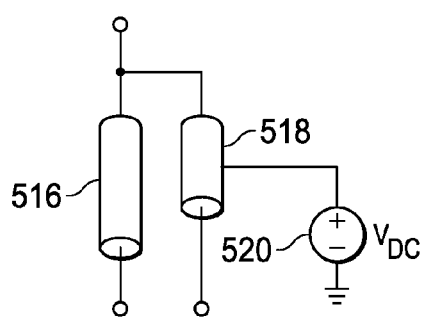
Figure 5D:
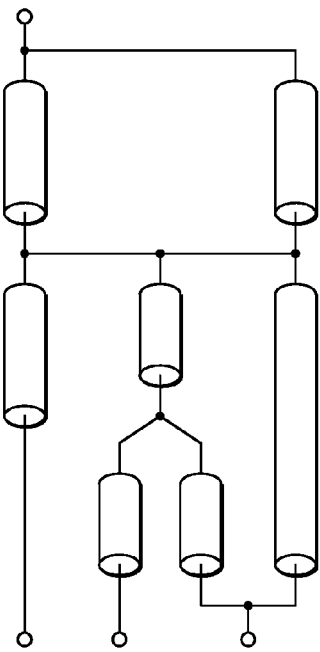

In each of the previous examples, switches 214 connect a single transmission line, or multiple single transmission lines in parallel. In FIG. 2, element 212 depicts a network of transmission lines that may generate more complex waveforms. In each example, the various transmission lines may have various lengths. FIGS. 5A-5D illustrate examples of networks of transmission lines (FIG. 2, 212) that may be selected by switches (FIG. 2, 214). FIG. 5A illustrates two transmission lines 500 and 502 connected in parallel, and that parallel combination connected in series with another transmission line 504. FIG. 5B illustrates two transmission lines 506 and 508 connected in series with a resistance 510 between them, and that combination connected in parallel with a transmission line 512, and that combination connected in series with transmission line 514. FIG. 5C illustrates a transmission line 516 connected in parallel to a transmission line 518, and transmission line 518 has a DC voltage 520 connected to its outer conductor. FIG. 5D has multiple combinations of transmission lines just to illustrate that complex networks of transmission lines may be used to generate complex waveforms. In addition, as discussed above in conjunction with FIG. 2, transmission lines in networks may have different characteristic impedances.

Figure 6A:
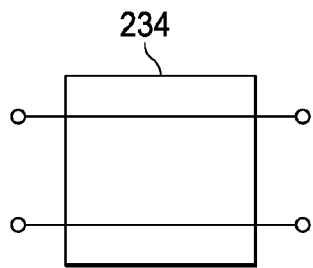
FIGS. 6A, 6B, and 6C are block diagram schematics illustrating alternative example embodiments of impedance networks.
Figure 6B:
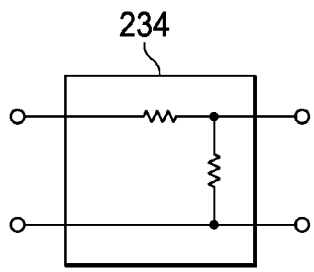
Figure 6C:
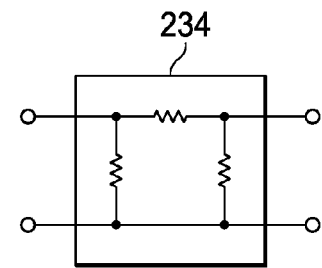

In the example of FIG. 2, there may be an optional impedance network 234 between the first switch 204 and the DUT. In the example of FIG. 6A, an impedance network 234 may be just wires or a transmission line. In the example of FIG. 6B, an impedance network 234 may be a resistive attenuator. In the example of FIG. 6C, an impedance network 234 may be a more complex network of passive components.

The two examples of FIGS. 3C and 4 illustrate that a system as depicted in FIG. 2 can generate a wide variety of voltage waveforms having a wide variety of pulse widths, multiple levels, and both positive and negative peaks. The examples of FIGS. 5A-5D illustrate that transmission lines can be combined into complex networks for generating complex waveforms. One system as depicted in FIG. 2 can provide voltage waveforms replicating voltage waveforms generated by standard ESD test systems in multiple industries with vastly different requirements. For example, a voltage waveform as in FIG. 3C is useful for impedance characterization of an ESD protection device, and the test may be repeated with different impedances to provide additional holding points. In a specific example, a system substantially as in FIG. 2, with one transmission line for 300 nanosecond pulses, one transmission line for 200 nanosecond pulses, and two transmission lines for 40 nanosecond pulses, has been used to replicate ISO and IEC waveforms for on-wafer testing having four steps. As an additional example, a bipolar voltage waveform as in FIG. 4 is useful for replicating ESD tests used in the automotive industry. In a specific example, a system substantially as in FIG. 2 has been used to generate a bipolar 11-kilovolt waveform that replicated the results of a Zwickau ESD test.

An additional advantage of a TLP system as in FIG. 2 is that parallel transmission lines can deliver more current than a single transmission line or transmission lines in series. In particular, the current required by some ESD tests in the automotive industry exceeds the current that can be supplied by a typical single transmission line system. A typical single-line TLP system can provide about 10A-30A, but a TLP system as in FIG. 2 with four transmission lines can provide four times that amount of current.

Figure 7:
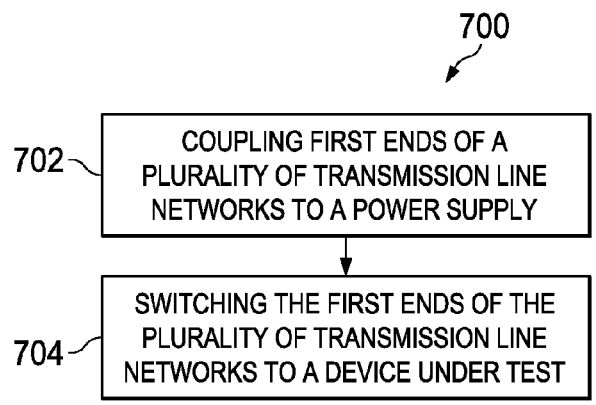
FIG. 7 is a flow chart of an example embodiment of a process for generating ESD test voltage waveforms.

FIG. 7 illustrates a method 700 of ESD testing. At step 702, first ends of a plurality of transmission line networks are coupled to a power supply. At step 704, the first ends of the plurality of transmission line networks are switched to a device under test.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A system, comprising:
   a power supply;
   a plurality of transmission lines with at least one transmission line from the plurality of transmission lines is a different length than the others in the plurality of transmission lines;
   a first switch coupled to first ends of the plurality of transmission lines, where when the first switch is in a first switch state the first ends of the plurality of transmission lines are connected to the power supply and when the first switch is in a second switch state the first ends of the plurality of transmission networks are coupled to a node for connection to a device under test; and
   a plurality of second switches configured to couple first ends of a portion of the transmission lines to the first switch.

2. The system of claim 1, further comprising:
   a plurality of third switches configured to couple second ends of the transmission lines to terminations.

3. A system, comprising:
   a power supply;
   a plurality of transmission line networks with at least one transmission line network from the plurality of transmission line networks is a different type than the others in the plurality of transmission line networks;
   a first switch coupled to first ends of the plurality of transmission line networks, where when the first switch is in a first switch state the first ends of the plurality of transmission line networks are connected to the power supply and when the first switch is in a second switch state the first ends of the plurality of transmission networks are coupled to node for connection to a device under test; and
   a plurality of second switches configured to couple first ends of a portion of the transmission line networks to the first switch.

4. The system of claim 3, further comprising:
   a plurality of third switches configured to couple second ends of the transmission line networks to terminations.

5. The system of claim 4, where the second ends of the transmission line networks are coupled to separate terminations.

6. The system of claim 4, where second ends of at least one transmission line network are coupled to a plurality of terminations.

7. The system of claim 4, where at least one termination comprises a voltage clamp.

8. The system of claim 4, where at least one termination comprises a Zener diode.

9. The system of claim 4, where at least one termination comprises a non-linear resistance.

10. The system of claim 4, where at least one termination comprises an active device.

11. The system of claim 3, further comprising an impedance network between the first switch and the device under test.

12. The system of claim 3, where at least one transmission line network is an individual transmission line.

13. The system of claim 3, where at least one transmission line network comprises a plurality of interconnected transmission lines.

14. The system of claim 3, where at least one transmission line network comprises a transmission line having a power supply connected to its outer conductor.

15. The system of claim 3, where at least one transmission line network comprises two transmission lines with a resistance in series between them.

16. The system of claim 3, where at least a first transmission line has a different characteristic impedance than a second transmission line.

\* \* \* \* \*